United States Patent
Eggum

(10) Patent No.: US 6,749,067 B2
(45) Date of Patent: Jun. 15, 2004

(54) WAFER CARRIER DOOR WITH FORM FITTING MECHANISM COVER

(75) Inventor: Shawn D. Eggum, Lonsdale, MN (US)

(73) Assignee: Entegris, Inc., Chaska, MN (US)

( * ) Notice: Subject to any disclaimer, the term of this patent is extended or adjusted under 35 U.S.C. 154(b) by 0 days.

(21) Appl. No.: 10/345,088

(22) Filed: Jan. 14, 2003

(65) Prior Publication Data

US 2003/0146218 A1 Aug. 7, 2003

Related U.S. Application Data

(60) Provisional application No. 60/349,708, filed on Jan. 16, 2002.

(51) Int. Cl.[7] ............................................. B65D 85/48
(52) U.S. Cl. ......................................... 206/710; 206/454
(58) Field of Search ................................ 206/454, 710, 206/711, 712; 220/323; 292/36, 66; 118/500; 414/217, 412

(56) References Cited

U.S. PATENT DOCUMENTS

| 4,046,410 | A | * | 9/1977 | Connell | 292/36 |
| 4,718,552 | A | | 1/1988 | Rossi et al. | |
| 5,915,562 | A | | 6/1999 | Nyseth et al. | |
| 5,957,292 | A | | 9/1999 | Mikkelsen et al. | |
| 6,220,438 | B1 | * | 4/2001 | Hirohata et al. | 206/454 |
| 6,457,598 | B1 | * | 10/2002 | Hsieh et al. | 206/710 |

FOREIGN PATENT DOCUMENTS

WO    WO 01/04022 A1    1/2001

* cited by examiner

Primary Examiner—Luan K. Bui
(74) Attorney, Agent, or Firm—Patterson, Thuente, Skaar & Christensen, P.A.

(57) ABSTRACT

A wafer container and improved door. The wafer container door has a latch mechanism cover adapted to retain and guide the latch mechanism components. The latch mechanism cover is form fitted to the latch mechanism components and may have apertures, creating a cover with an open architecture. The open architecture is of benefit for making the area under the mechanism cover more easily cleanable.

22 Claims, 4 Drawing Sheets

WAFER CARRIER DOOR WITH FORM FITTING MECHANISM COVER

This application claims the benefit under 35 U.S.C 119(e) of U.S. Provisional Application No. 60/349,708, filed Jan. 16, 2002.

FIELD OF THE INVENTION

This invention relates to wafer containers and more particularly it relates to sealable wafer enclosures having doors with latch mechanisms.

BACKGROUND OF THE INVENTION

Processing of semi-conductor wafers into finished electronic components typically requires many processing steps where the wafers must be handled and processed. The wafers are very valuable, and are extremely delicate and easily damaged by physical and electrical shocks. In addition, successful higher yield processing requires the utmost in cleanliness, freedom from particulates and other contaminants. As a result, specialized containers or carriers have been developed for use during processing, handling and transport of wafers. These containers protect the wafers from physical and electrical hazards, and are sealable to protect the wafers from contaminants. Such wafer carriers or containers generally comprise an enclosure having a number of wafer holding shelves inside. One side of the container is open for access, and is closed by a door. The door has a latch mechanism to securely retain and seal it in place. Normally, the latch mechanism is enclosed to protect it from damage and accidental actuation.

Although wafer enclosures are used in clean environments, undesirable contaminants accumulate on and in the enclosure over time. Particulate contaminants are generated through frictional contact between parts of the enclosure and in the operation of loading and unloading wafers from the enclosure. Accordingly, an important characteristic for wafer containers is that they must be thoroughly cleanable to ensure that process cleanliness is maintained. Cleaning is generally accomplished with a liquid solution, and the parts are dried afterward with compressed air or other gas.

Latch mechanism enclosures present particular problems in efficient cleaning of wafer carriers. In prior art carriers, such as those shown in U.S. Pat. No. 5,915,562 to Nyseth and Krampotich, and U.S. Pat. No. 5,957,292 to Mikkelsen, et. al. for example, each of which are fully incorporated herein by reference, the latch mechanisms are located in cavities in the door that are covered by flat panels. Although such enclosure helps to isolate and contain particle generation from the latch mechanism itself, access to the latch mechanism area for cleaning and drying is limited. In addition, relatively large cavities with correspondingly large interior surface areas are formed around the latch components. The combination of limited access with large surface areas and volumetric areas makes it generally infeasible to effectively clean and dry the mechanism area with the enclosure in place. Also, large cavities may retain a correspondingly larger amount of particulate or other contaminant material. As a result, at least partial disassembly of the mechanism enclosure is necessary. This can be a tedious, labor-intensive process that can introduce process inefficiencies and delays. Accordingly, a mechanism enclosure that allows increased access to the mechanism components and that offers a reduced surface area inside the enclosure is desirable.

One way of reducing the interior surface area of the latch enclosure is to exclude unnecessary areas by conforming the enclosure to the latch components it protects. A wafer carrier door having a latch mechanism cover that more closely conforms to the contour of the latch mechanism was disclosed in PCT Application No. WO 01/04022 A1. The disclosed mechanism cover does not cover the entire latch cavity, but rather covers only the latch arms, the motion translation mechanism and a portion of the manual handle. The disclosed mechanism cover conforms to the contour of the latching arms for only a portion of one side of the latching arms. Thus, there are significant areas unnecessarily captured under the mechanism cover, particularly the areas between the latching arms and door margins. These areas remain difficult to clean and dry with the mechanism cover in place.

Moreover, manufacturing, and subsequent assembly, and disassembly of wafer carrier doors is sometimes complicated by previous designs of the latch mechanisms and latch mechanism covers. Typically, the latch mechanism components are retained and guided by structures formed in the door chassis. The mechanism cover merely serves to cover the latching components in such designs, and does not typically function to guide or laterally retain the components. It is generally necessary to form retaining and guide structures for latch components on the door chassis itself in such designs. These structures may be difficult to form, add complexity to the door chassis, and may complicate the assembly and disassembly process.

What is needed is an improved wafer container and door that overcomes the difficulties presented by the prior art designs.

SUMMARY OF THE INVENTION

The present invention is a wafer container and improved door. The door has a latch mechanism cover that retains and guides the latch mechanism components. The latch mechanism cover may be form fitted to the shape of the latch mechanism, thus minimizing the surface area of the door chassis captured under the mechanism cover, and thereby reducing the amount of particulates and other contaminants retained in the structure of the door. The retaining and guiding function of the latch mechanism cover may eliminate the need for guiding and retaining structures on the door chassis, thereby simplifying manufacture, assembly and disassembly of the door. Moreover, the latch mechanism cover may have a plurality of apertures for providing cleaning access to areas underneath.

Thus, the invention generally includes a wafer container and door. The door generally includes a door chassis with at least one latch mechanism. The latch mechanism has at least one slidable latch arm. A latch mechanism cover disposed over the latch mechanism, and the cover includes a panel portion substantially covering the latch mechanism and having an inner surface confronting the latch mechanism. A pair of spaced-apart guide portions projects from the inner surface of the panel portion adjacent the latch arm. The latch arm is longitudinally slidably disposed between the guide portions, which are adapted to slidably guide and locate the latch arm.

An object and advantage of the invention is a latch mechanism cover that provides protection for the latch mechanism parts.

Another object and advantage of the invention is a latch mechanism cover that retains and guides the latch mechanism parts.

Another object and advantage of the invention is a latch mechanism cover that allows cleaning and drying of area under the cover while the cover remains in place.

Yet another object and advantage of the invention is to provide a latch mechanism cover with apertures forming an open architecture mechanism cover that improves cleanability of the portions of the door located under the mechanism cover.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE INVENTION

The accompanying Figures depict embodiments of the wafer container of the present invention, and features and components thereof. Any references to front and back, right and left, top and bottom, upper and lower, and horizontal and vertical are intended for convenience of description, not to limit the present invention or its components to any one positional or spacial orientation. Any dimensions specified in the attached Figures and this specification may vary with a potential design and the intended use of an embodiment of the invention without departing from the scope of the invention.

Figure 1:
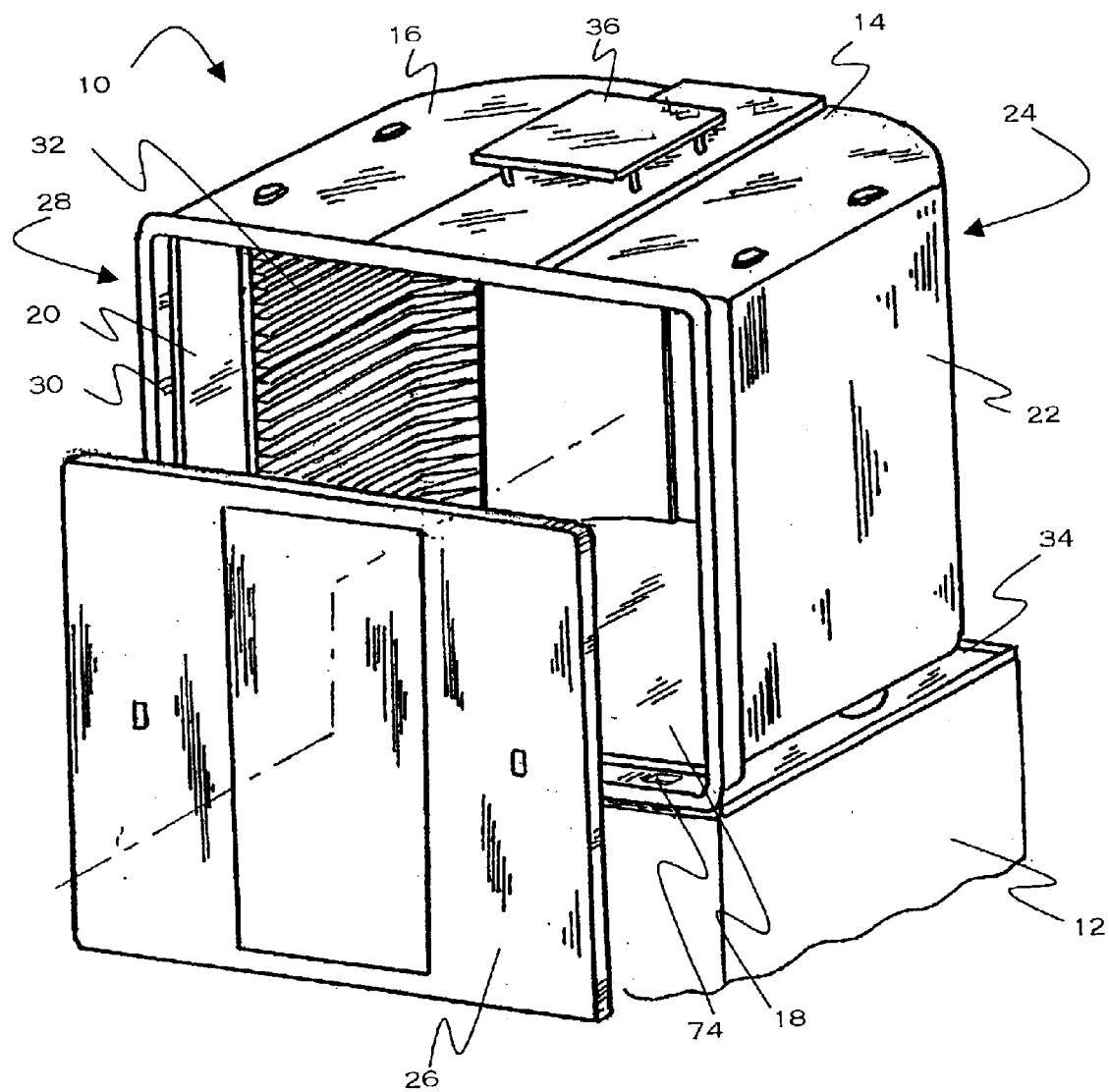
FIG. 1 is a perspective view of a wafer container and door.

Referring first to FIG. 1, a wafer container 10 is depicted seated on automatic processing equipment 12. Wafer container 10 has an enclosure portion 14, constructed of polycarbonate plastic, and having a top 16, a bottom 18, a pair of opposing sides 20, 22, and a back 24. A door 26 completes the enclosure by enclosing the open front 28 of enclosure portion 14, fitting into door recess 30. Wafer supports 32 are provided to support semi-conductor wafers (not depicted) within the enclosure 14. Kinematic coupling 34, mounted to the exterior surface of enclosure bottom 18 is provided to facilitate automated handling of the container during use and to provide a reference datum for locating the wafers in the housing during processing. Robotic lifting flange 36 is mounted on the exterior surface of enclosure top 16 and is provided to facilitate automated handling and transport of container 10 during use.

Figure 2:
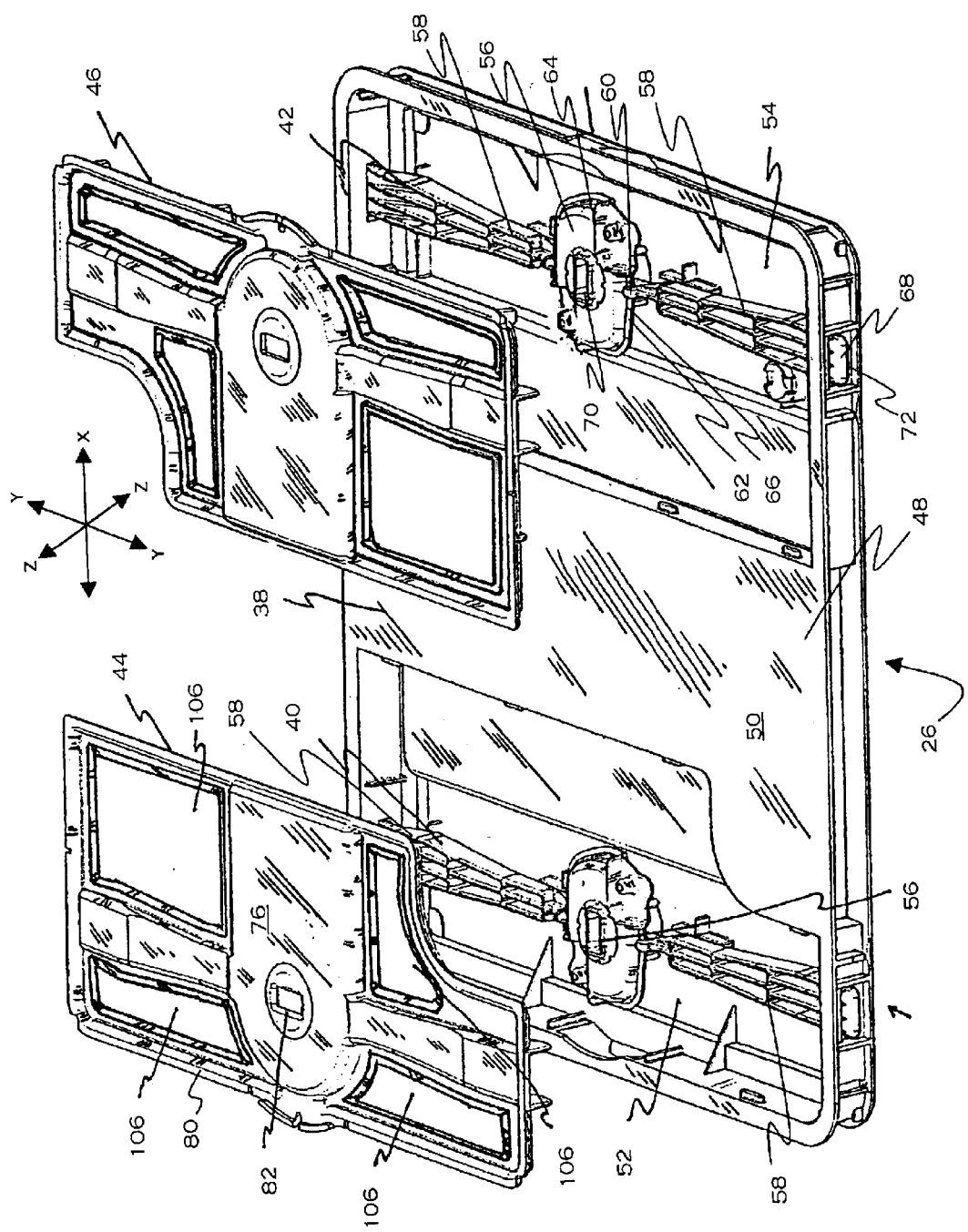
FIG. 2 is an enlarged perspective view of a wafer container door according to the present invention.

Referring to FIG. 2, the wafer carrier door 26 of the present invention is depicted. Door 26 generally includes a door chassis 38, latch mechanisms 40, 42, and latch mechanism covers 44, 46. FIG. 2 also designates, for reference purposes, the relative directions of x-y-z coordinates as applied to the wafer carrier door 26. Any reference herein to movement or constraint of components in an x-axis direction, a y-axis direction, or a z-axis direction, or to rotation about an x-axis, a y-axis or a z-axis, relates to these coordinate axes. The y-axis is oriented top to bottom on door 26 as installed on the container 10, the x-axis is oriented perpendicular to the y-axis and side-to-side on door 26 as installed on the container 10, and the z-axis is perpendicular to both the x-axis and the y-axis and is oriented perpendicular with the plane formed by door 26 when installed on container 10.

Door chassis 38 may be formed from any material suitable for a wafer carrier, such as polycarbonate plastic, and generally includes a planar body portion 48 forming a door exterior surface 50. Recesses 52, 54, may be provided in door chassis 38 for receiving latch mechanisms 40, 42.

Latch mechanisms 40, 42, each generally include an actuating portion 56, and one or more laterally slidable latch arms 58. Although actuating portion 56 is depicted herein as a rotating cam member, any other suitable member or mechanism capable of imparting a linear sliding motion to latch arms 58 may be also be used, including a rack and pinion mechanism such as depicted in PCT Application No. WO 01/04022 A1. Further details of a cam operated latching mechanism suitable for use with the present invention are disclosed in co-pending U.S. patent applications Ser. Nos. 10/307,894, 10/317,023, and 10/318,374, each commonly owned by the owners of the present invention, and each hereby fully incorporated by reference herein.

In the depicted embodiment, latching arms 58 each have a cam follower portion 60 engaged with the periphery 62 of cam member 64 at cam portion 66. Each of latching arms 58 has a latching portion 68 at the end opposite from cam follower portion 60. When a key (not shown) is inserted into key slot 70 and rotated, cam follower portion 60 slides along cam portion 66. Due to the shape of cam member 64, latching arms 58 are translated radially in the y-axis direction, extending or retracting latching portions 68 through latch openings 72. Latching portions 68 are received by latch receptacles 74 in the wafer container 10, allowing the door 26 to be secured in place.

Figure 3:
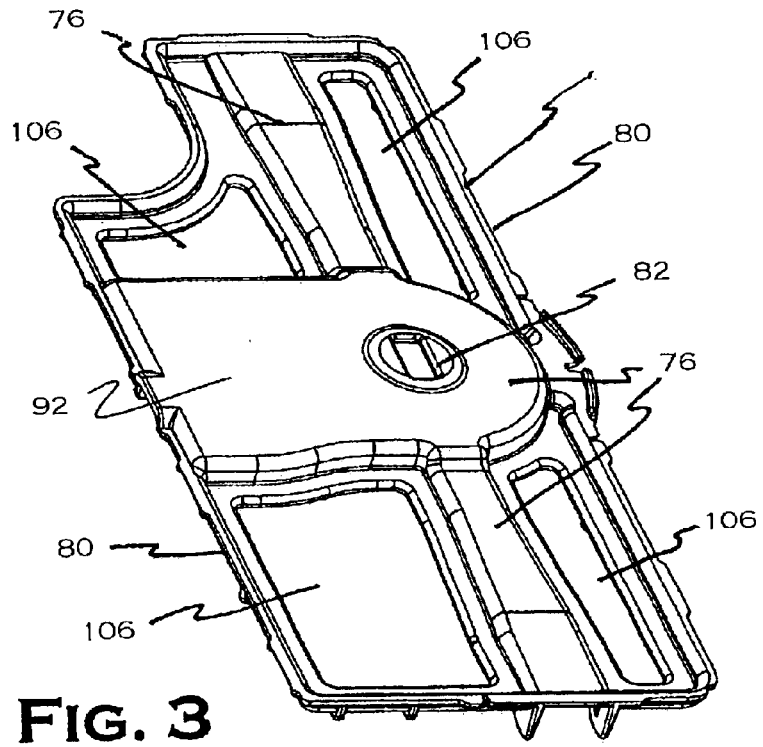
FIG. 3 is a perspective view of the latch mechanism cover of the present invention from an exterior view.
Figure 4:
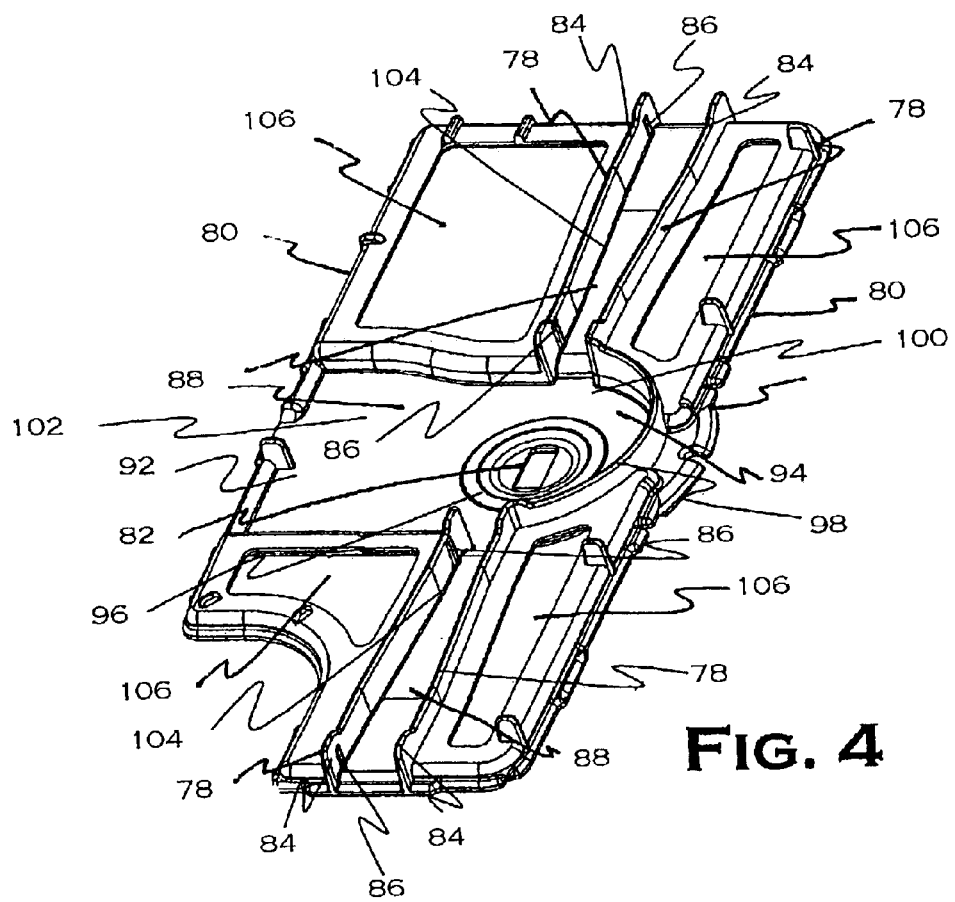
FIG. 4 is a perspective view of the latch mechanism cover of the present invention from an interior view.

Referring now to FIGS. 2–4, an embodiment of the latch mechanism cover 44 of the present invention is depicted. Although, for simplicity, the following description refers only to latch mechanism cover 44, the description may be assumed to apply to either latch mechanism cover 44, 46 as depicted in FIG. 2. FIG. 3 depicts latch mechanism cover 44 as viewed from the exterior of the door 26, and FIG. 4 depicts latch mechanism cover 44 from the interior of the door 26. Latch mechanism cover 44 generally includes a panel portion 76 and projecting guide portions 78. Latch mechanism cover 44 may also include a perimeter frame 80 for attaching the cover 44 to door chassis 38. Key opening 82 may be provided to enable a key to be inserted into key slot 70.

As depicted, panel portion 76 is substantially coextensive with, and covers, latch mechanism 40. Projecting guide portions 78, depicted here in the form of ribs 84, extend downwardly adjacent latch arms 58. Although depicted here as ribs 84, it will be readily appreciated that guide portions 78 may be provided in a variety of other forms according to the invention, including a plurality of projecting posts or other structures. Each projecting guide portion 78 may have one or more bearing surfaces 86 in slidable contact with latch arm 58. These bearing surfaces 86 serve to guide and locate latch arm 58, as well as constrain lateral movement of latch arm 58 in the x-axis direction. Inner surface 88 of panel portion 76 confronts latch arm 58 and may also have a portion in slidable contact with latch arm 58. Thus, panel portion 76 serves to retain and constrain movement of latch arm 58 in the z-axis direction. The projecting guide portions 78, together with inner surface 88 of panel portion 76, define a channel 90 for each latch arm 58.

Panel portion 76 includes a center portion 92 covering the actuating portion 56 of latch mechanism 40. Center portion 92 has an inner surface 94 confronting actuating portion 56 of latch mechanism 40, including cam member 64. Bearing portion 96 may slidably contact cam member 64, retaining cam member 64 in place and preventing movement in the z-axis direction. Downwardly projecting rib 98 may be provided at the periphery of center portion 92 to form an actuating mechanism enclosure 100. This actuating mechanism enclosure 100, together with channels 90, forms a substantially complete latch enclosure 104 for latch mechanism 40. This latch enclosure 104 is essentially form-fitted to the shape of the latch mechanism 40.

Of course, it will be appreciated that latch mechanism 40 may take a variety of alternative forms and configurations, including varying types of actuating mechanisms as set forth above, as well a single, or any other number, of latching arms. The latch mechanism cover of the present invention may be applied to any such alternative configurations.

Referring again to FIGS. 2–4, perimeter frame 80 may be provided to attach mechanism cover 44 to door chassis 38. In another aspect of the invention, perimeter frame 80, together with latch enclosure 104, defines a plurality of apertures 106. The apertures 106 provide access for cleaning substantially all areas of door chassis 38 covered by latch mechanism cover 44, as well as, latch mechanism 40 itself. With apertures 106, or without perimeter frame 80, latch mechanism cover 44 has an open architecture. This open architecture design opens up the latch enclosure areas and provide easier access for cleaning and drying of the portions of door 26 located under the latch mechanism cover 44. It is preferable that the apertures 106 have an aggregate area of at least a majority of the aggregate area under latch mechanism cover 44 not disposed substantially directly over latch mechanism 40. In a preferred embodiment the apertures may be at least 2 inches square in area.

Figure 5:
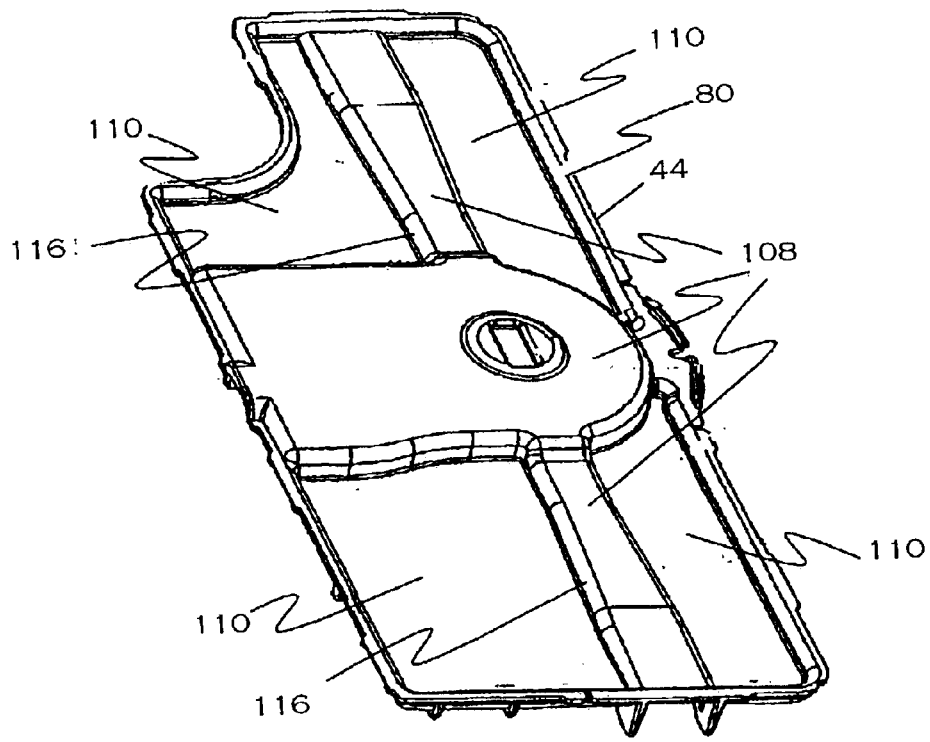
FIG. 5 is a perspective view of a further embodiment of a latch mechanism cover of the present invention from an exterior view.
Figure 6:
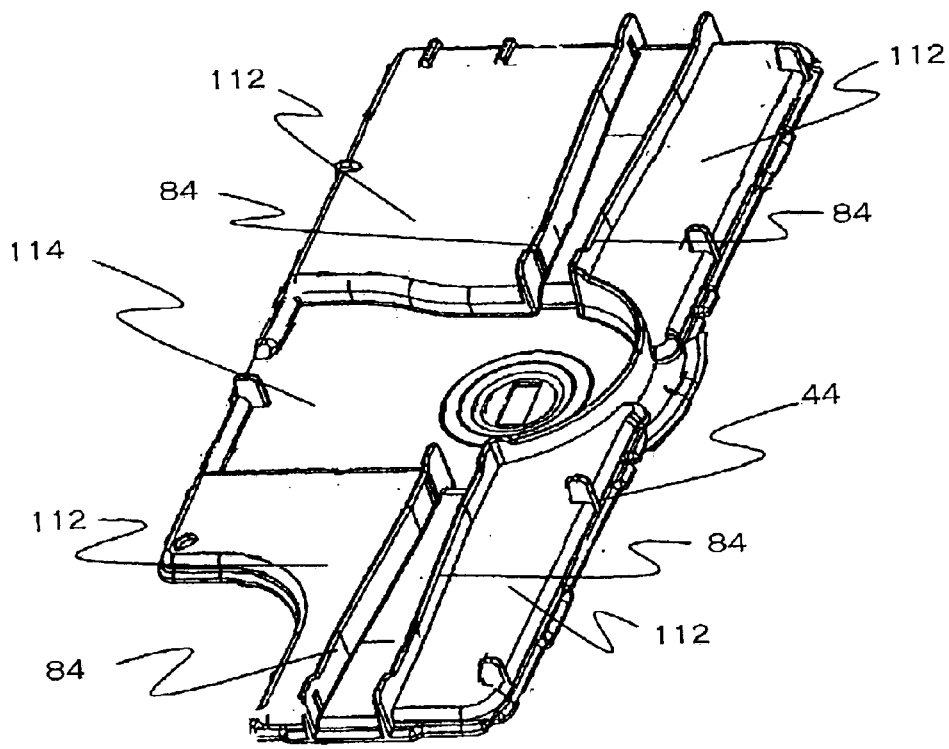
FIG. 6 is a perspective view of the latch mechanism cover of FIG. 5 from an interior view.

Referring to FIGS. 2, 4, and 5, a further embodiment of the latch mechanism cover 44 is disclosed. In this embodiment, a latch enclosure portion 108 is substantially coextensive with, and is form-fitted over, latch mechanism 40. The latch enclosure portion 108 is defined by perimeter frame 80 and recessed portions 110. The recessed portions 110 have an inner surface 112 that is disposed closer to door chassis 38 than inner surface 114 of latch enclosure portion 108 when latch mechanism cover 44 is attached to door chassis 38. Significantly, the recessed portions 110 are formed from solid material and do not have apertures in this embodiment. As depicted, ribs 84 may be provided to guide and retain the latch mechanism components as described previously. As an alternative, recessed portions 110 may be sufficiently recessed so that an inner surface of side portions 116 of latch enclosure portion 108 may be positioned to guide and laterally retain latch arms 58.

Although the description above contains many specificities, these should not be construed as limiting the scope of the invention but as merely providing illustrations of some of the presently preferred embodiments of the invention. Thus, the scope of the invention should be determined by the appended claims and their legal equivalents, rather than by the examples given.

What is claimed is:

1. A wafer container comprising:
   an enclosure portion having at least a top, a bottom, a pair of opposing sides, a back, an open front, and a door to close the open front, said door comprising:
   a door chassis;
   at least one latch mechanism disposed on said door chassis, said latch mechanism including an actuating portion and at least one longitudinally slidable elongate latch arm portion operably coupled therewith; and
   a latch mechanism cover disposed over said at least one latch mechanism, said latch mechanism cover including a panel portion substantially covering said latch mechanism and having an inner surface confronting said latch mechanism, said latch mechanism cover further including a pair of spaced-apart guide portions projecting from said inner surface adjacent said at least one latch arm portion, said at least one elongate latch arm portion being longitudinally slidably disposed between said guide portions, wherein said guide portions are adapted to slidably guide and locate said latch arm portion.

2. The wafer container of claim 1, wherein said latch arm portion is in slidable contact with at least a portion of said panel portion.

3. The wafer container of claim 1, wherein latch arm portion is in slidable contact with at least a portion of each of said inwardly projecting guide portions.

4. The wafer container of claim 1, wherein said latch mechanism cover is substantially coextensive with said latch mechanism.

5. The wafer container of claim 1, wherein said door chassis has a recessed portion with a perimeter, wherein said latch mechanism is disposed in said recessed portion, and wherein said latch mechanism cover further includes a frame portion adapted to attach said latch mechanism cover to said door chassis at said perimeter.

6. The wafer container of claim 5, wherein said frame portion and said panel portion define a plurality of apertures for providing cleaning access to said door chassis and said latch mechanism.

7. A wafer container comprising:
   an enclosure portion having at least a top, a bottom, a pair of opposing sides, a back, an open front, and a door to close the open front, said door comprising:
   a door chassis;
   at least a first latch mechanism on said door chassis, said latch mechanism including a rotatable cam and a pair of longitudinally slidable latch arms operably coupled to said rotatable cam; and
   a latch mechanism cover covering said first latch mechanism, said latch mechanism cover including a panel portion and a plurality of projecting guide ribs, said guide ribs being arranged so as to define a pair of channels for receiving said latch arms, each of said pair of latch arms being slidably disposed in a separate one of said channels.

8. The wafer container of claim 7, wherein said latch mechanism cover is substantially coextensive with said latch mechanism.

9. The wafer container of claim 7, wherein each said latch arm is in slidable contact with at least a portion of said panel portion.

10. The wafer container of claim 7, wherein each said latch arm is in slidable contact with at least a portion of each guide rib defining the channel in which the latch arm is disposed.

11. The wafer container of claim 7, wherein said door chassis has a recessed portion with a perimeter, wherein said latch mechanism is disposed in said recessed portion, and wherein said latch mechanism cover further includes a frame portion adapted to attach said latch mechanism cover to said door chassis at said perimeter.

12. The wafer container of claim 11, wherein said frame portion and said panel portion define a plurality of apertures for providing cleaning access to said door chassis and said latch mechanism.

13. A wafer container comprising:
an enclosure portion having at least a top, a bottom, a pair of opposing sides, a back, an open front, and a door to close the open front, said door comprising:
a door chassis;
at least one latch mechanism disposed on the door chassis, said at least one latch mechanism including an elongate, longitudinally slidable latch arm; and
a latch mechanism cover covering said at least one latch mechanism, said latch mechanism cover having means for guiding and laterally constraining said latch arm.

14. The wafer container of claim 13, wherein said latch mechanism cover is substantially coextensive with said latch mechanism.

15. The wafer container of claim 13, wherein said latch mechanism cover includes a panel portion covering said latch mechanism.

16. The wafer container of claim 15, wherein said means for guiding and laterally constraining said latch arm includes a pair of guide portions projecting from said latch mechanism cover laterally adjacent said latch arm, said latch arm being slidably disposed between said guide portions.

17. The wafer container of claim 15, wherein said latch arm is in slidable contact with at least a portion of said panel portion.

18. The wafer container of claim 15, wherein said door chassis has a recessed portion with a perimeter, wherein said latch mechanism is disposed in said recessed portion, and wherein said latch mechanism cover further includes a frame portion adapted to attach said latch mechanism cover to said door chassis at said perimeter.

19. The wafer container of claim 15, wherein said frame portion and said panel portion define a plurality of apertures for providing cleaning access to said door chassis and said latch mechanism.

20. A wafer container comprising:
an enclosure portion having at least a top, a bottom, a pair of opposing sides, a back, an open front, a wafer support structure in the enclosure defining a plurality of slots, each slot adapted to receive a semiconductor wafer, and a door to close the open front of the enclosure, said door comprising:
a door chassis;
a latch mechanism on said door chassis, said latch mechanism including a rotatable cam and a pair of longitudinally slidable latch arms operably coupled to said rotatable cam; and
a latch mechanism cover covering at least a portion of said first latch mechanism, said latch mechanism cover defining a pair of guide channels, each channel arranged to receive a separate one of said latch arms so that the latch arm is longitudinally slidably disposed therein.

21. The wafer container of claim 20, wherein each said latch arm is in slidable contact with at least a portion of said panel portion.

22. The wafer container of claim 20, wherein each said latch arm is in slidable contact with at least a portion of an interior surface of the guide channel in which the latch arm is disposed.

* * * * *